US012051761B2

(12) United States Patent
Cai et al.

(10) Patent No.: US 12,051,761 B2
(45) Date of Patent: Jul. 30, 2024

(54) MULTI-SEMICONDUCTOR LAYER PHOTODETECTOR AND RELATED METHOD

(71) Applicant: GlobalFoundries Singapore Pte. Ltd., Singapore (SG)

(72) Inventors: Xinshu Cai, Singapore (SG); Yongshun Sun, Singapore (SG); Kiok Boone Elgin Quek, Singapore (SG); Khee Yong Lim, Singapore (SG); Shyue Seng Tan, Singapore (SG); Eng Huat Toh, Singapore (SG); Thanh Hoa Phung, Singapore (SG); Cancan Wu, Singapore (SG)

(73) Assignee: GLOBALFOUNDRIES SINGAPORE PTE LTD, Singapore (SG)

( * ) Notice: Subject to any disclaimer, the term of this patent is extended or adjusted under 35 U.S.C. 154(b) by 282 days.

(21) Appl. No.: 17/662,095

(22) Filed: May 5, 2022

(65) Prior Publication Data
US 2023/0361236 A1 Nov. 9, 2023

(51) Int. Cl.
*H01L 31/103* (2006.01)
*H01L 21/8238* (2006.01)
(Continued)

(52) U.S. Cl.
CPC .... *H01L 31/103* (2013.01); *H01L 21/823878* (2013.01); *H01L 27/0629* (2013.01); *H01L 31/022408* (2013.01); *H01L 31/1824* (2013.01)

(58) Field of Classification Search
CPC .......... H01L 31/103; H01L 21/823878; H01L 27/0629; H01L 31/022408; H01L 31/1824; H01L 31/035281
See application file for complete search history.

(56) References Cited

U.S. PATENT DOCUMENTS 9,728,667 B1 8/2017 Johnson et al.
2007/0218613 A1* 9/2007 Lee ................... H01L 27/14647
438/197

(Continued)

FOREIGN PATENT DOCUMENTS

KR 101146590 B1 5/2012

OTHER PUBLICATIONS

Extended European Search Report from corresponding European Patent Application No. 22203442.3 dated May 12, 2023.
(Continued)

*Primary Examiner* — Karen Kusumakar
*Assistant Examiner* — Adam S Bowen
(74) *Attorney, Agent, or Firm* — Anthony Canale; Hoffman Warnick LLC

(57) ABSTRACT

A structure includes a photodetector including alternating p-type semiconductor layers and n-type semiconductor layers in contact with each other in a stack. Each semiconductor layer includes an extension extending beyond an end of an adjacent semiconductor layer of the alternating p-type semiconductor layers and n-type semiconductor layers. The extensions provide an area for operative coupling to a contact. The extensions can be arranged in a cascading, staircase arrangement, or may extend from n-type semiconductor layers on one side of the stack and from p-type semiconductor layers on another side of the stack. The photodetector can be on a substrate in a first region, and a complementary metal-oxide semiconductor (CMOS) device may be on the substrate on a second region separated from the first region by a trench isolation. The photodetector is capable of detecting and converting near-infrared (NIR) light, e.g., having wavelengths of greater than 0.75 micrometers.

12 Claims, 13 Drawing Sheets

(51) Int. Cl.
*H01L 27/06* (2006.01)
*H01L 31/0224* (2006.01)
*H01L 31/18* (2006.01)

(56) References Cited

U.S. PATENT DOCUMENTS

2008/0277701 A1* 11/2008 Lee .................. H01L 27/14689
257/292
2018/0317289 A1 11/2018 Frolov et al.

OTHER PUBLICATIONS

Hsieh et al., "Photon-Detection-Probability Simulation Method for CMOS Single-Photon Avalanche Diodes," Sensors, 20:436, 2020.
Huang et al., "Single-photon avalanche diodes in 0.18-um high-voltage CMOS technology," Optics Express, 25:13333-39, Jun. 2017.

* cited by examiner

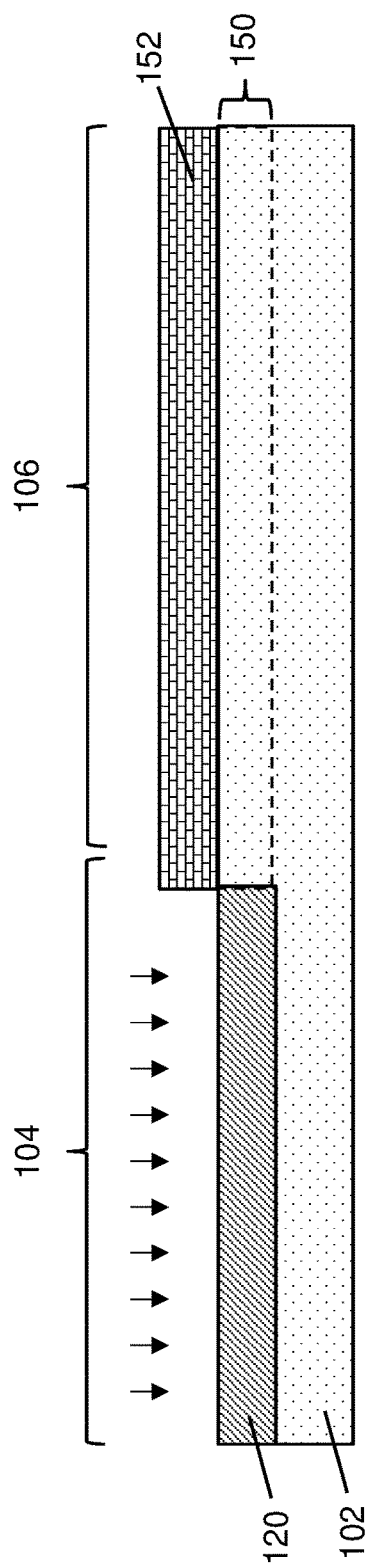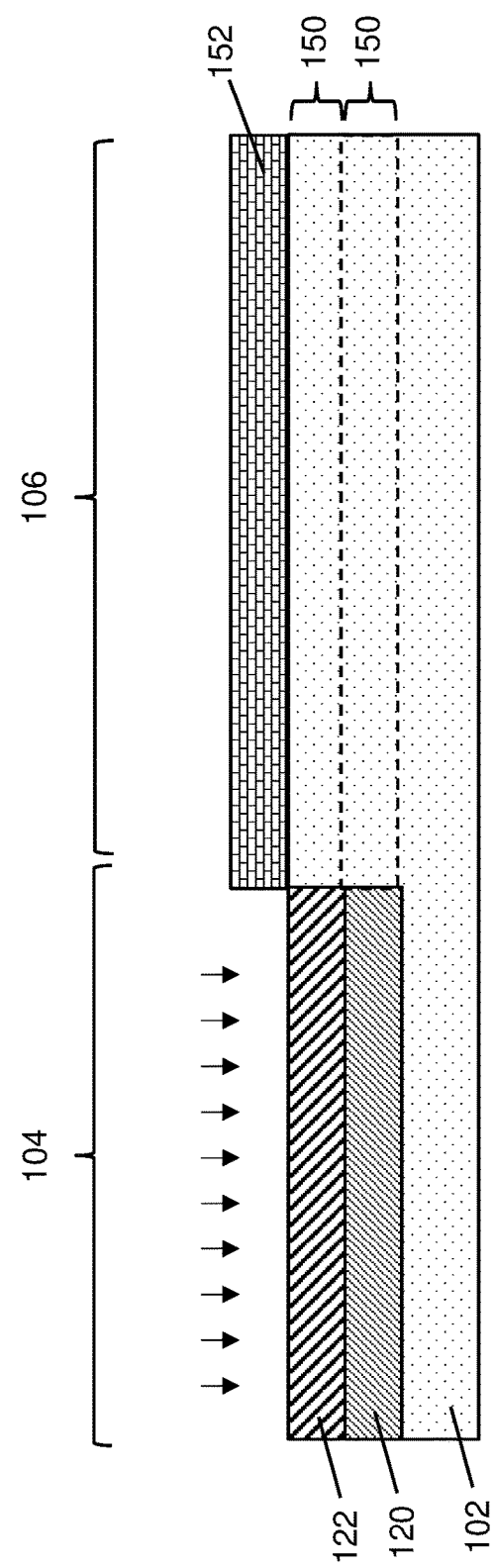

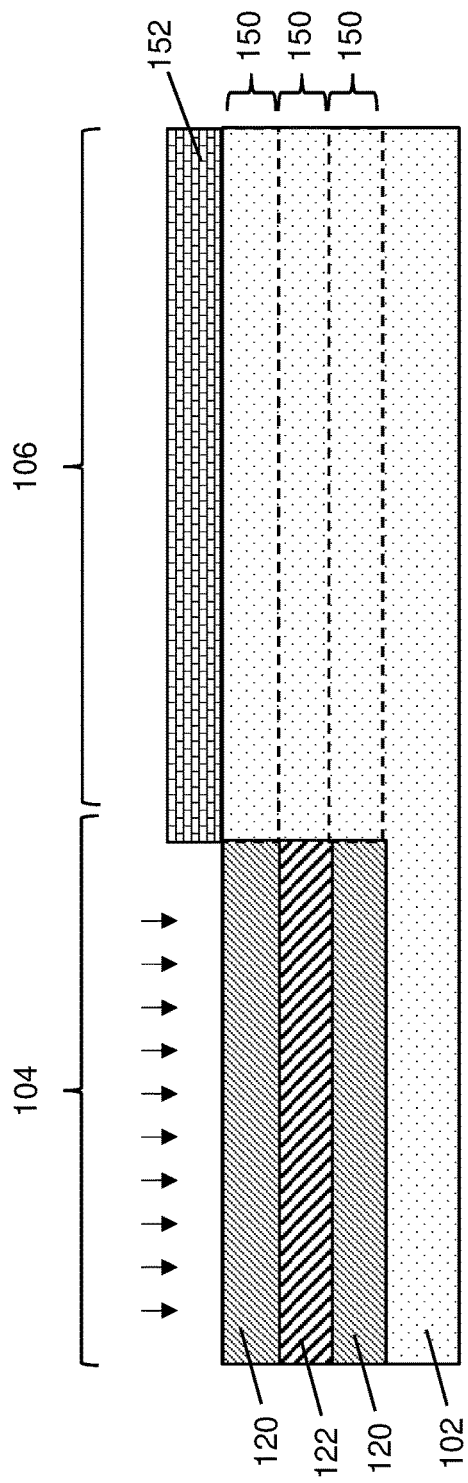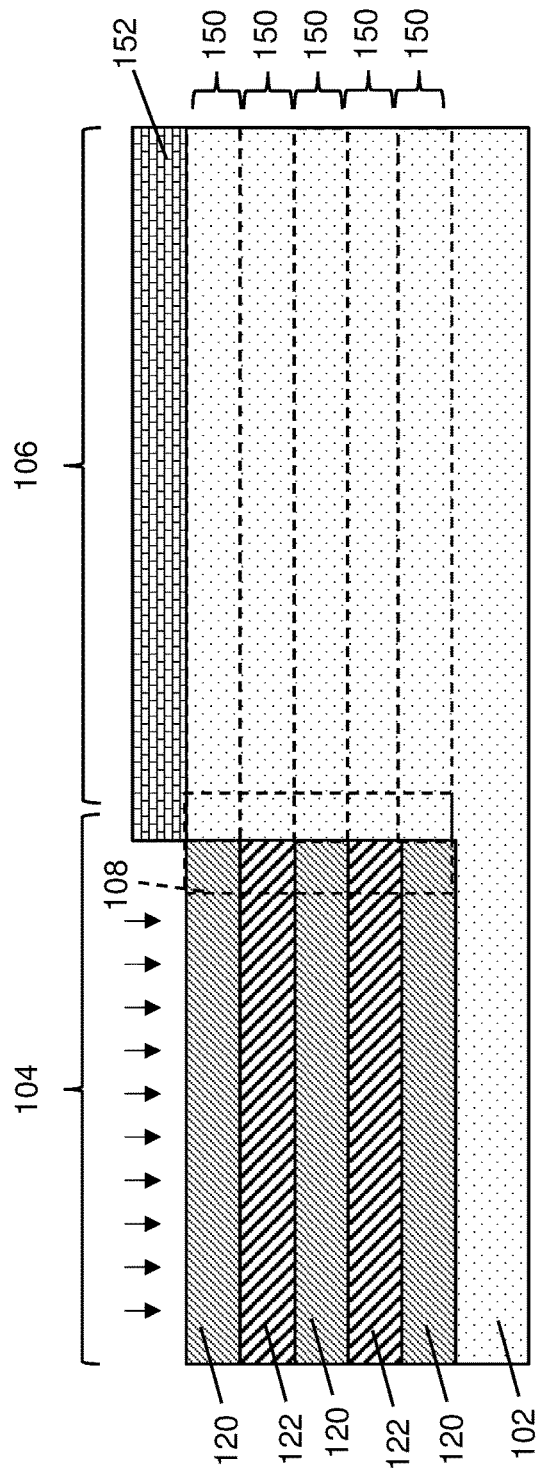

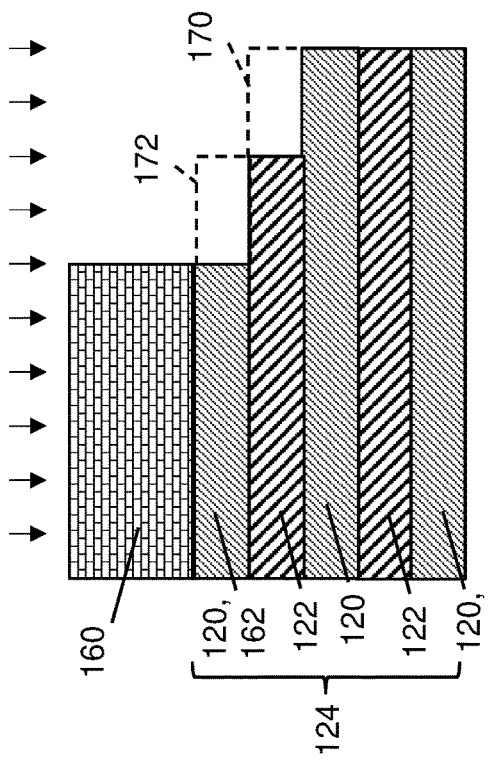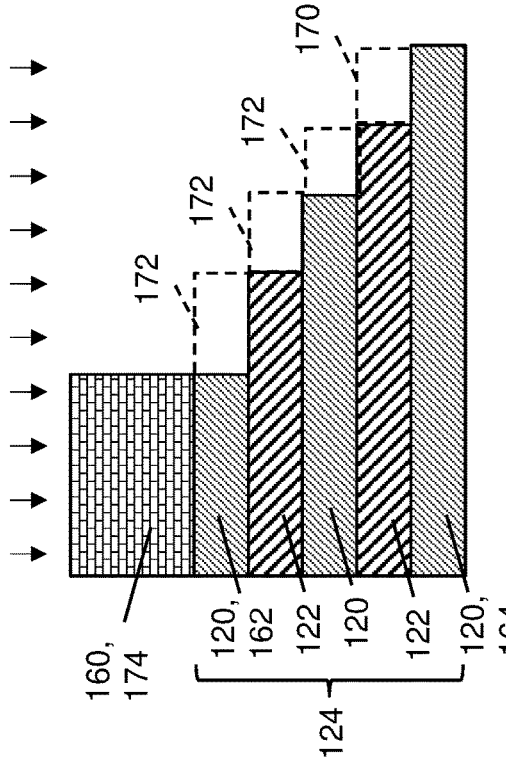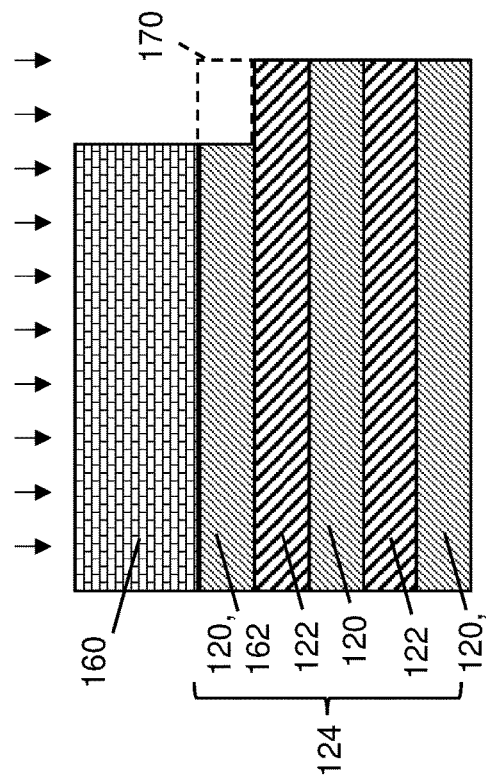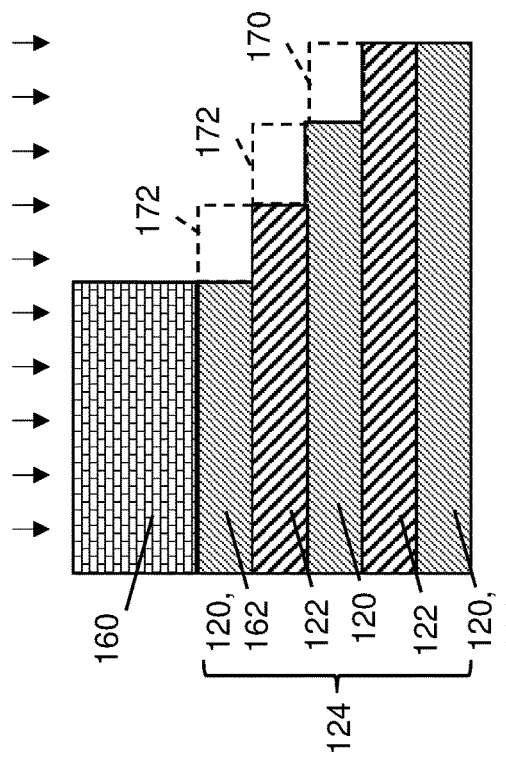

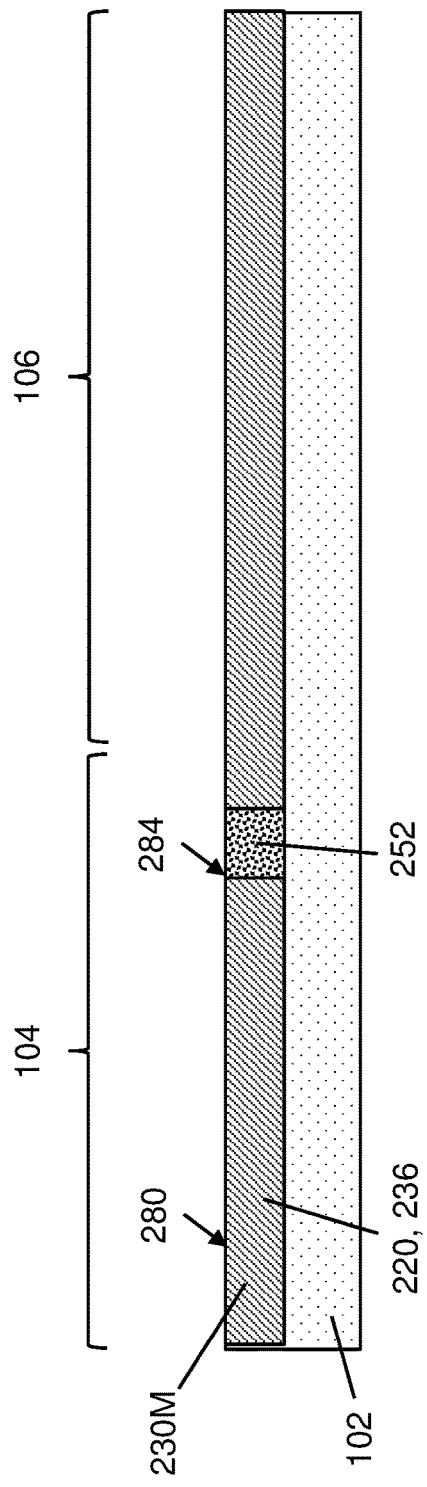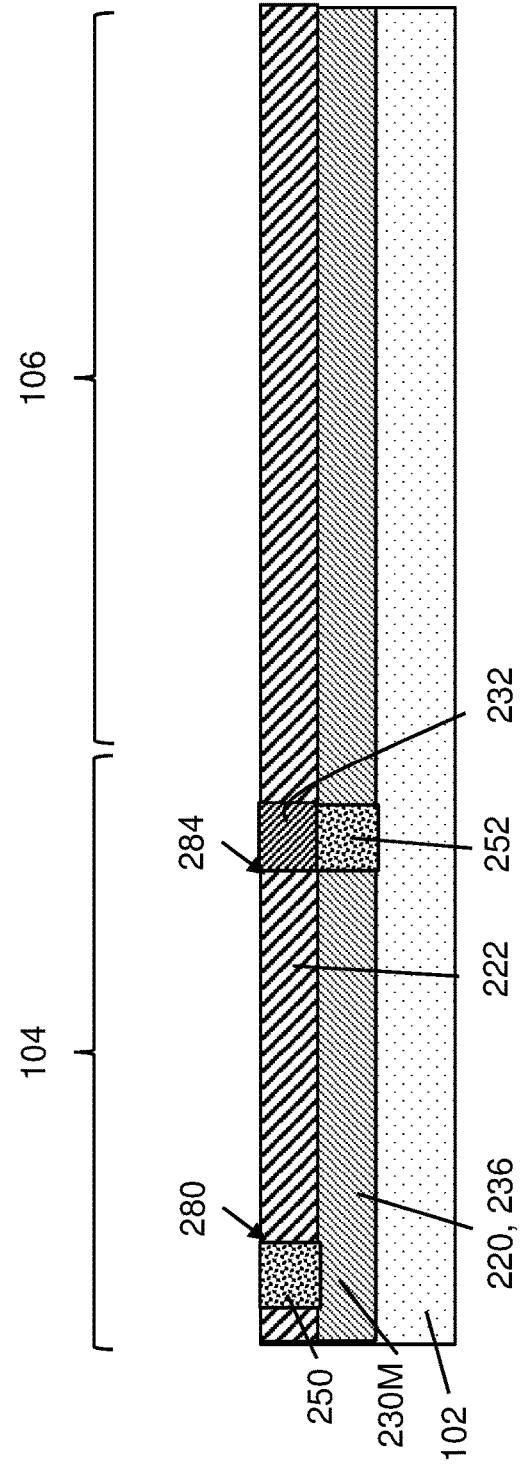

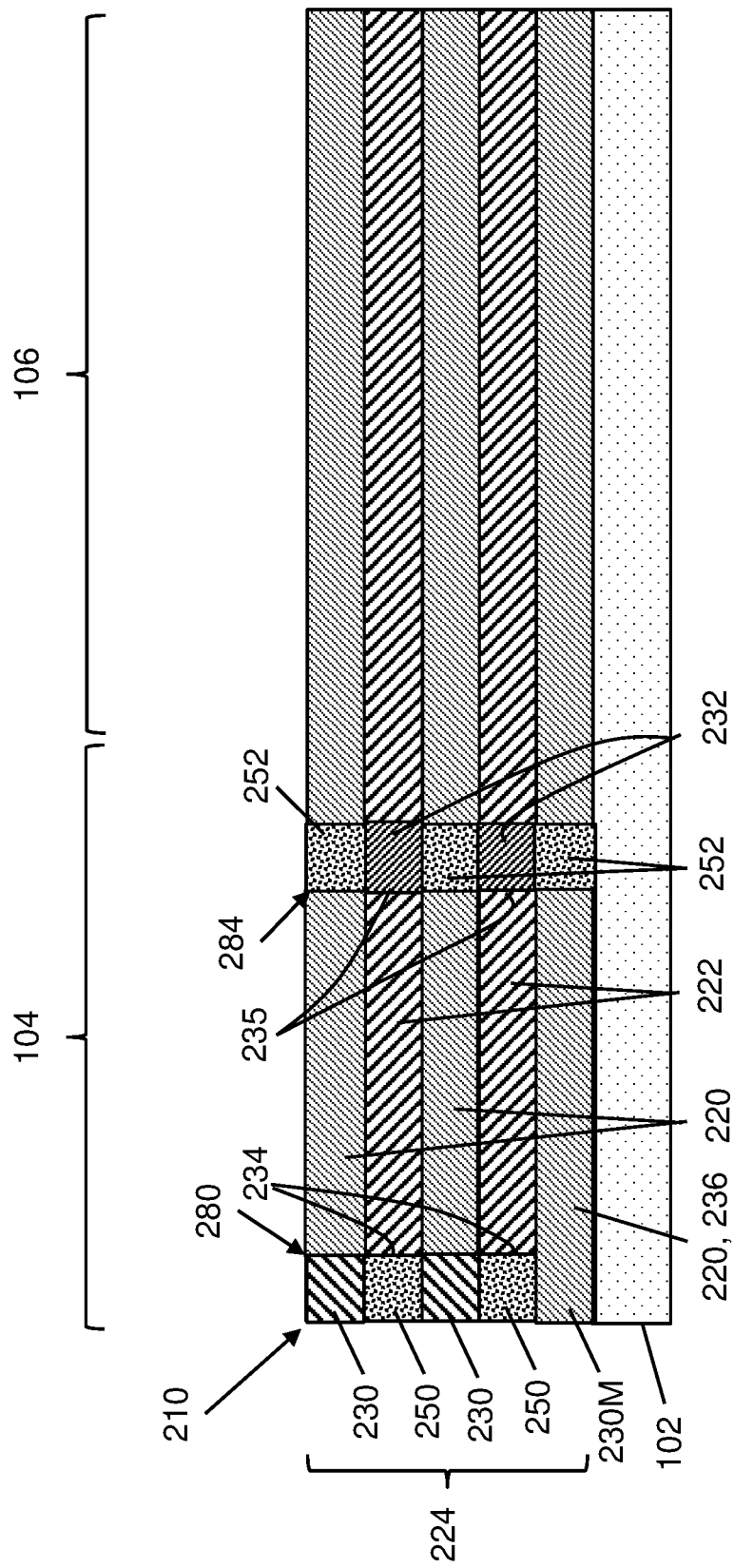

MULTI-SEMICONDUCTOR LAYER PHOTODETECTOR AND RELATED METHOD

BACKGROUND

The present disclosure relates to photodetectors, and more specifically, to a photodetector with multiple semiconductor layers capable of near-infrared detection.

Photonics integrated circuits include photodetectors to convert optical signals to electrical signals. Certain long wavelengths of light, such as near-infrared light, are difficult to detect in an efficient manner without complex PN junction structures. The PN structures may require complicated implanting processes to form, for example, deep PN junctions or double PN junctions.

SUMMARY

An aspect of the disclosure is directed to a structure, comprising: a substrate including a first region including a photodetector including: a stack including alternating p-type semiconductor layers and n-type semiconductor layers in contact with each other, wherein a plurality of the semiconductor layers includes an extension extending beyond an end of an adjacent semiconductor layer of the alternating p-type semiconductor layers and n-type semiconductor layers; and a contact operatively coupled to each extension.

Another aspect of the disclosure includes a structure, comprising: a substrate including a first region adjacent a second region; a photodetector in the first region, the photodetector including: a stack of alternating p-type semiconductor layers and n-type semiconductor layers in contact with each other, wherein a plurality of the semiconductor layers includes an extension extending beyond an end of an adjacent semiconductor layer of the alternating p-type semiconductor layers and n-type semiconductor layers, and a contact operatively coupled to each extension; a complementary metal-oxide semiconductor (CMOS) device in the second region; and a trench isolation separating the first region and the second region.

An aspect of the disclosure related to a method, comprising: forming alternating p-type semiconductor layers and n-type semiconductor layers in a stack over a first region of a substrate with each semiconductor layer including an extension extending beyond an end of an adjacent semiconductor layer of the alternating p-type semiconductor layers and n-type semiconductor layers, each extension having the same doping type as the semiconductor layer adjacent thereto; and forming a contact operatively coupled to each extension.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 5, 6, 7 and 8 show cross-sectional views of forming alternating p-type and n-type semiconductor layers for the photodetector of FIG. 1, according to embodiments of the disclosure.

FIGS. 13, 14, 15 and 16 show cross-sectional views of forming the cascading, staircase arrangement within the alternating p-type and n-type semiconductor layers for the photodetector of FIGS. 1, 2 and 4, according to embodiments of the disclosure.

FIGS. 17, 18 and 19 show cross-sectional views of forming alternating p-type and n-type semiconductor layers for the photodetector of FIG. 3, according to other embodiments of the disclosure.

Figure 1:
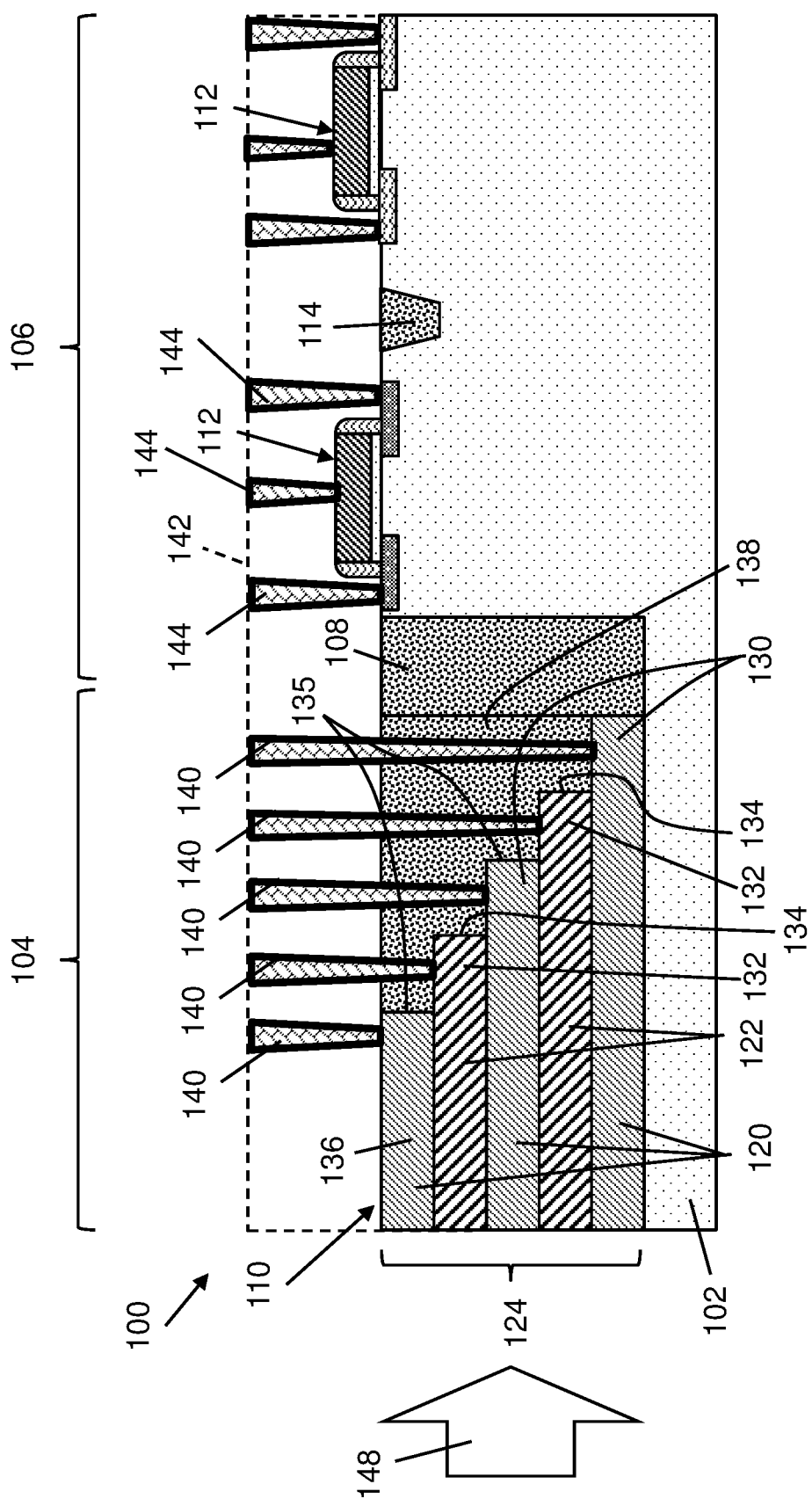
FIG. 1 shows a cross-sectional view of a structure including a photodetector, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a semiconductor layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment"

or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure including a photodetector (e.g., a photodiode) including a stack including alternating p-type semiconductor layers and n-type semiconductor layers in contact with each other. Each semiconductor layer includes an extension extending beyond an end of an adjacent semiconductor layer of the alternating p-type semiconductor layers and n-type semiconductor layers. The extensions provide an area for operative coupling to a contact. The extensions can be arranged in a cascading, staircase arrangement, or may extend from n-type semiconductor layers on one side of the stack and from p-type semiconductor layers on another side of the stack. The photodetector can be on a substrate in a first region, and a complementary metal-oxide semiconductor (CMOS) device may be on the substrate in a second region separated from the first region by a trench isolation. The photodetector is simpler than conventional photodetectors to form, and is capable of detecting and converting near-infrared (NIR) light, e.g., having wavelengths of greater than 0.75 micrometers.

Figure 2:
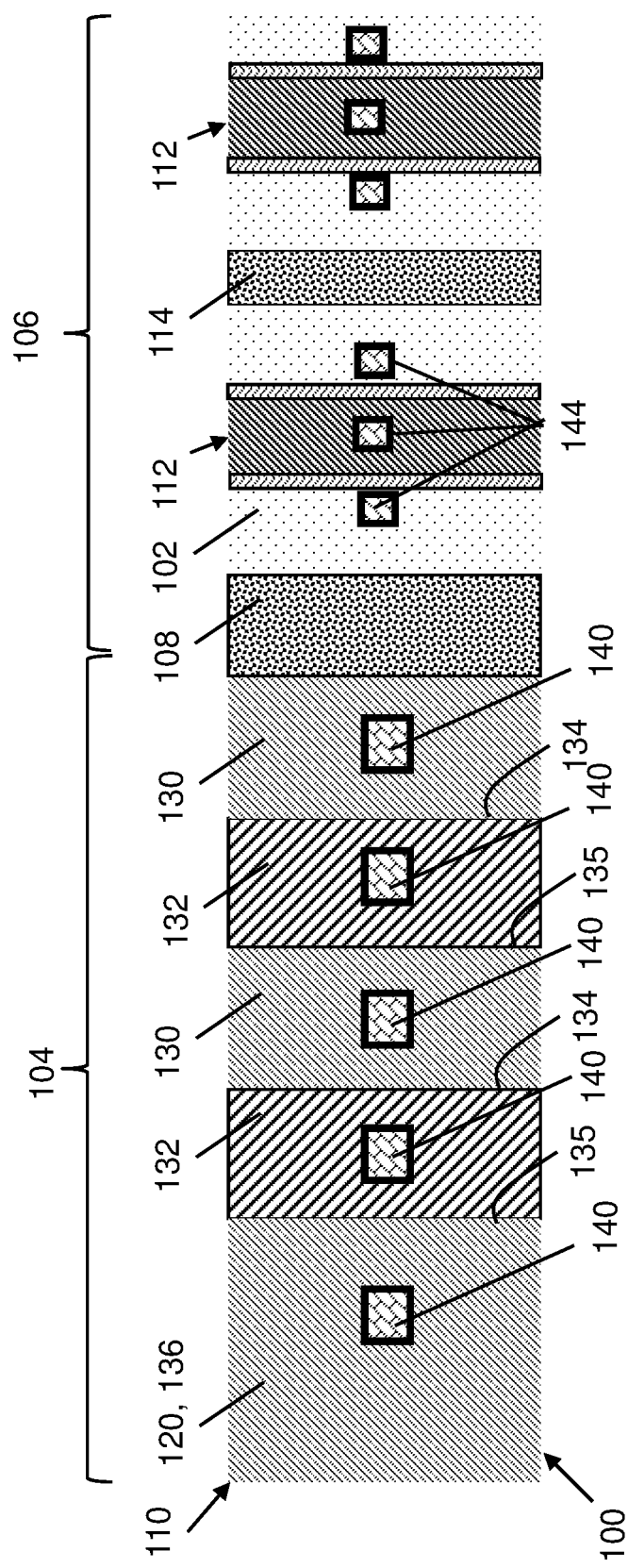
FIG. 2 shows a schematic top-down view of the structure including the photodetector of FIG. 1.

FIG. 1 shows a cross-sectional view and FIG. 2 shows a top-down view of a structure 100, according to embodiments of the disclosure. Structure 100 may include a substrate 102 including a first region 104 and a second region 106. One of the regions, 104 as shown, includes a photodetector 110. The other region, 106 as shown, may include a complementary metal-oxide semiconductor (CMOS) device(s) 112. Substrate 102, and any other semiconductor material described herein, may include any now known or later developed semiconductor material appropriate for photonics integrated circuits (PICs), e.g., silicon, silicon germanium, among others. Regions 104, 106 may be electrically isolated by a trench isolation (TI) 108, which may extend to at least the depth of photodetector 110. CMOS device(s) 112 may include any now known or later developed active devices, e.g., transistors. CMOS device(s) 112 may be electrically isolated by trench isolation(s) (TI(s)) 114. TI 108 and TI(s) 114 may be formed by creating a trench to a desired depth and width and may include any appropriate dielectric for trench isolations such as but not limited to silicon nitride ($Si_3N_4$), silicon oxide ($SiO_2$), fluorinated $SiO_2$ (FSG), hydrogenated silicon oxycarbide (SiCOH), porous SiCOH, and/or an amorphous poly/oxide combination, filling the trench.

Photodetector 110 may include a stack 124 of alternating p-type semiconductor layers 120 and n-type semiconductor layers 122 in contact with each other. Any number of each layer 120, 122 can be provided so long as stack 124 includes at least three semiconductor layers, e.g., one p-type semiconductor layer 120 and two n-type semiconductor layers 122, or two p-type semiconductor layers 120 and one n-type semiconductor layer 122. In the non-limiting examples shown in the drawings, typically five layers are shown with three p-type semiconductor layers 120 and two n-type semiconductor layers 122. P-type semiconductor layers 120 (hereinafter, where appropriate, "p-type layers 120") and n-type semiconductor layers 122 (hereinafter, where appropriate, "n-type layers 122") are in direct contact with one another. That is, there is no intervening material between the layers.

Figure 4:
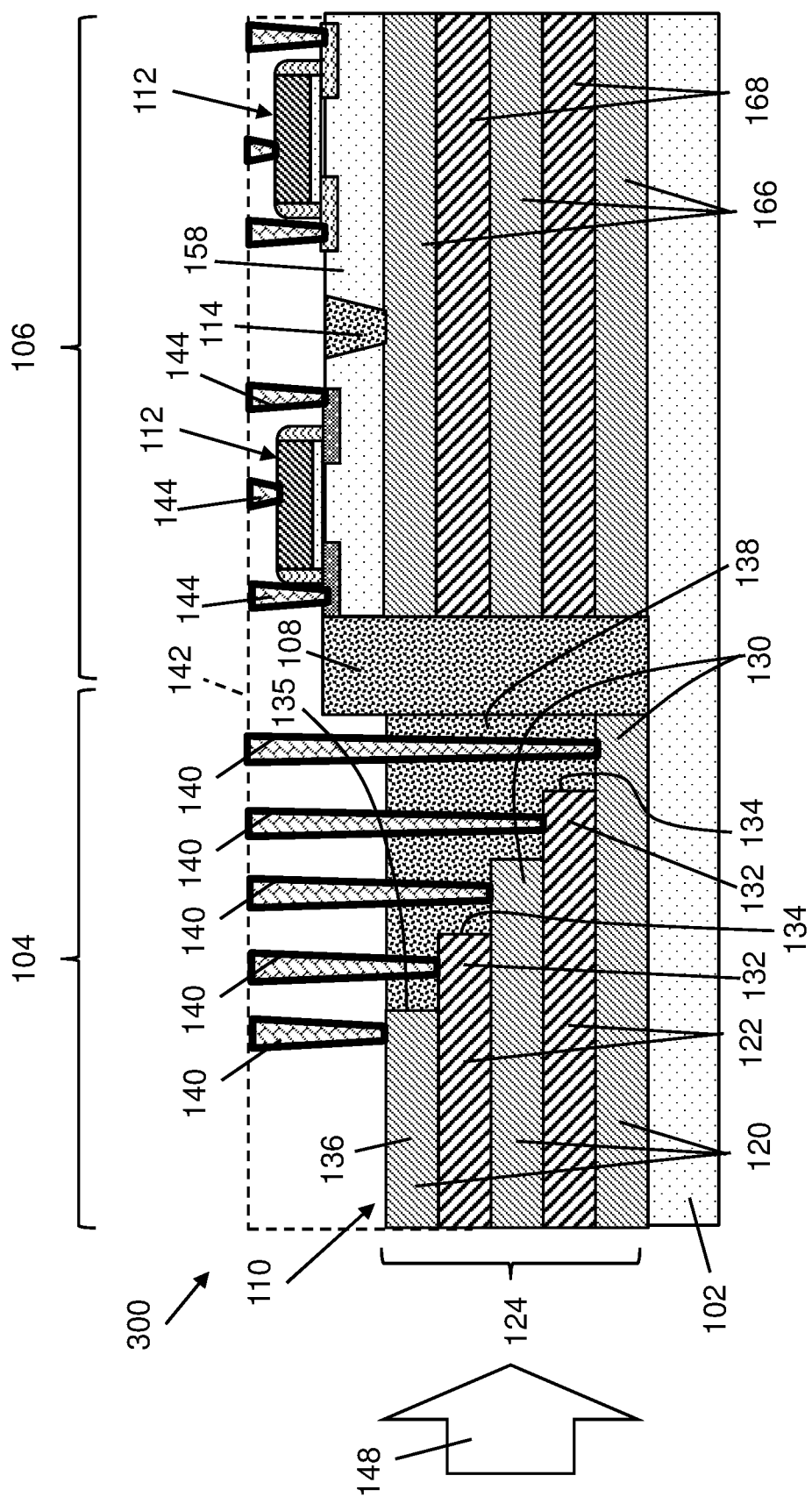
FIG. 4 shows a cross-sectional view of a structure including a photodetector, according to alternative embodiments of the disclosure.

A plurality of semiconductor layers 120, 122 of stack 124 may include an extension 130, 132 extending beyond an end 134, 135 of an adjacent semiconductor layer 122, 120 of alternating p-type layers 120 and n-type layers 122, respectively. That is, extensions 130 of p-type layers 120 extend beyond ends 134 of adjacent n-type layers 122 thereover; and extensions 132 of n-type layers 122 extend beyond ends 135 of adjacent p-type layers 120 thereover. In FIG. 1, each semiconductor layer 120, 122 in stack 124, except an uppermost layer 136, includes an extension 130, 132. More particularly, p-type layers 120 include extensions 130, and n-type layers 122 include extensions 132. In FIGS. 1, 2 and 4, extensions 130, 132 are in a cascading, staircase arrangement on a selected side (right side, as shown) of stack 124. In this manner, each layer 120, 122 with its respective extension 130, 132 may be longer than an adjacent layer thereover. While the opposing side of layers 120, 122 is shown in a vertically aligned manner, this is not necessary in all cases.

A dielectric 138 (not shown in FIG. 2) fills the space over extensions 130, 132. Dielectric 138 may include any now known or later developed interlayer dielectric material such as but not limited to silicon oxide. In this embodiment, each p-type layer 120 and each n-type layer 122 and respective extensions 130, 132 thereof includes monocrystalline semiconductor (e.g., silicon), doped with an appropriate dopant. In non-limiting examples, n-type dopants may include but are not limited to: phosphorous (P), arsenic (As), antimony (Sb); and p-type dopants may include but are not limited to: boron (B), indium (In) and gallium (Ga). As will be described further herein, each n-type layer 122 may include an n-type doped epitaxial semiconductor layer, and each p-type layer 120 may include a p-type doped epitaxial semiconductor layer.

Extensions 130, 132 provide landing locations for contacts 140. Hence, photodetector 110 of structure 100 also includes a contact 140 operatively coupled to each extension 130, 132. As illustrated, contact(s) 140 are operatively coupled to each extension 130, 132. That is, contact 140 lands at least partially on an upper surface of a respective stair (extension 130, 132) of the cascading, staircase arrangement. Contact(s) 140 can take any now known or later developed form, e.g., conductor within a refractory metal liner within dielectrics 138 and 142 (dashed box). Contact(s) 140 and/or conductive wires (not shown) coupled thereto may be routed in any manner to direct the electrical signal generated by photodetector 110 as required. Contact(s) 140 can be routed individually or combined at some location within structure 100.

Figure 3:
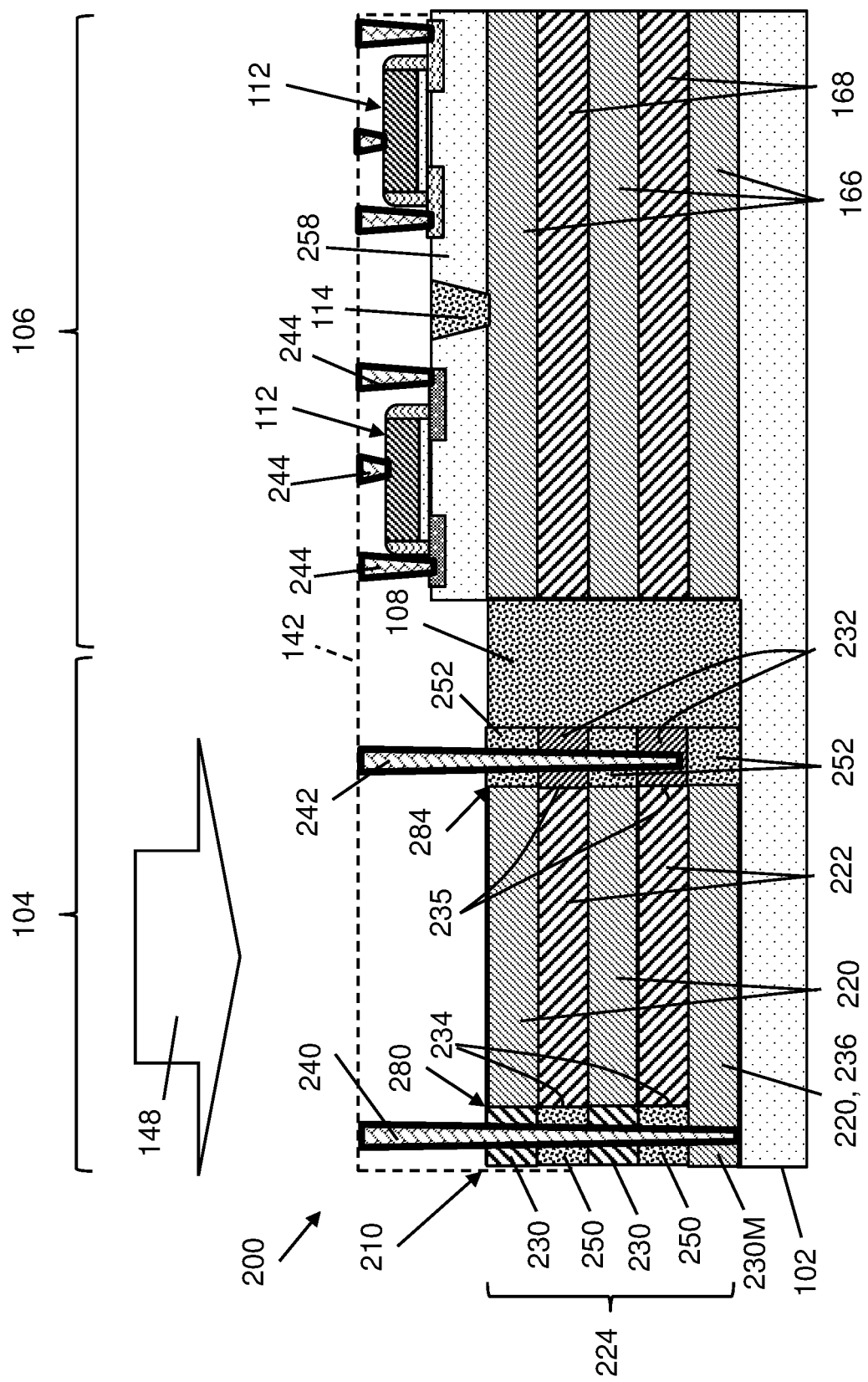
FIG. 3 shows a cross-sectional view of a structure including a photodetector, according to other embodiments of the disclosure.

FIG. 3 shows a schematic cross-sectional view a structure 200, according to other embodiments of the disclosure. Structure 200 may include substrate 102 including first region 104 and second region 106. One of the regions, first region 104 as shown, includes a photodetector 210. The other region, second region 106 as shown, may include CMOS device(s) 112, as previously described. Substrate 102, TI 108, CMOS device(s) 112 and TI(s) 114 may be arranged as described relative to FIGS. 1-2.

Photodetector 210 may include a stack 224 including alternating p-type semiconductor layers 220 and n-type semiconductor layers 222 in contact with each other. Any number of each layer 220, 222 can be provided, so long as stack 224 includes at least three semiconductor layers, e.g., one p-type semiconductor layer 220 and two n-type semiconductor layers 222, or two p-type semiconductor layers 220 and one n-type semiconductor layer 222. As noted, typically five layers are shown with three p-type semiconductor layers 220 and two n-type semiconductor layers 222. P-type semiconductor layers 220 (hereinafter, where appropriate, "p-type layers 220") and n-type semiconductor layers 222 (hereinafter, where appropriate, "n-type layers 222") are in direct contact with one another. That is, there is no intervening material between the layers.

As shown in FIG. 3, in this embodiment, extensions 230 of p-type layers 220 extend beyond ends 234 of n-type layers 222 on a first side 280 (e.g., left side as shown) of stack 224, and extensions 232 of n-type layers 222 extend beyond ends 235 of p-type layers 220 on a second side 284 (e.g., right side as shown) of stack 224. That is, each extension 230 of a p-type layer 220 extends beyond end 234 of an adjacent n-type layer 222 on first side 280 of stack 224. Similarly, each extension 232 of an n-type layer 222 extends beyond end 235 of an adjacent p-type layer 220 on second side 284 of stack 224. The first and second sides 280, 284 of stack 224 are shown as opposing sides for illustration purposes, but the sides can be any two different sides of stack 224. A lowermost layer 236 (shown as p-type layer 222) may include a non-discernible extension 230M, which is monocrystalline semiconductor of the same doping type as the semiconductor layer, i.e., it can just be the layer.

A dielectric 250 is positioned between p-type extensions 230 and a dielectric 252 is positioned between n-type extensions 232. Dielectrics 250, 252 may include but are not limited to silicon oxide, or other ILD material. Dielectrics 250, 252 need not be the same material. While shown between extensions 230, 232, dielectrics 250, 252 may also extend over and/or about sides of extensions 230, 232, e.g., where the latter are arranged as discrete fingers extending from layers 220, 222. As will be described further herein, each n-type layer 222 may include an n-type doped epitaxial semiconductor layer, and each p-type layer 220 may include a p-type doped epitaxial semiconductor layer. Layers 220, 222 are monocrystalline semiconductor, e.g., silicon, doped with the appropriate dopant. In contrast to FIGS. 1-2, extensions 230, 232 of p-type layers 220 and n-type layers 222, respectively, include polycrystalline semiconductor (e.g., polysilicon), doped with an appropriate dopant. The dopants may be selected from the groups previously described herein.

Photodetector 210 of structure 200 also includes a contact 240 operatively coupled to extensions 230, and a contact 242 operatively coupled to extensions 232. In this case, contact 240 to each extension 230 of p-type layers 220 extends through extensions 232 of p-type layers 220 (except perhaps extension 230M for a lowermost layer 236) and dielectric 250 positioned therebetween. In this manner, contact 240 extending through extensions 230 of p-type layers 220 may include a single contact. Similarly, a contact 242 operatively coupled to each extension 232 of n-type layers 222 extends through extensions 232 of n-type layers 222 and dielectric 252 positioned therebetween. Contact 242 extending through extensions 232 of n-type layers 222 may also include a single contact.

As shown in FIG. 3, as with the FIGS. 1-2 embodiments, substrate 102 may include second region 106 adjacent first region 104, and second region 106 is isolated from first region 104 by TI 108. Second region 106 may include CMOS device(s) 112 therein, as previously described.

FIG. 4 shows a cross-sectional view of a structure 300 that is identical to structure 100 in FIG. 1, except alternating p-type and n-type layers 166, 168 are also present in CMOS region 106. The underlying layers 166, 168 are under CMOS devices 112, which are built in/on an undoped semiconductor layer 158 over the alternating layers 166, 168, as will be described further herein.

In operation, as shown in FIGS. 1, 3 and 4, light 148 may enter photodetector 110, 210 and be converted to an electrical signal transmitted through contacts 140, 240, 242. Light can be delivered to photodetectors 110, 210 using any now known or later developed optical waveguide. Stack 124 allows light to penetrate deeper into photodetectors 110, 210 allowing longer wavelength light to penetrate deeper semiconductor layers 120, 122, 220, 222, and providing improved detection and flexibility. Photodetector 110, 210 can detect and converting near-infrared (NIR) light, e.g., having wavelengths of greater than 0.75 micrometers.

FIGS. 5-16 show cross-sectional views of a method according to embodiments of the disclosure. FIGS. 5-16 show embodiments of forming alternating p-type layers 120 and n-type layers 122 in stack 124 over first region 104 of substrate 102. Each semiconductor layer 120, 122 includes an extension 130, 132 extending beyond end 134, 135 of an adjacent semiconductor layer 122, 120 of the alternating p-type layers 120 and n-type layers 122. Each extension 130, 132 has the same doping type as the semiconductor layer 120, 122 adjacent thereto. The method may include forming extensions 130, 132 in a cascading, staircase arrangement on a selected side (e.g., right side) of stack 124, and forming contact 140 to each extension 130, 132, e.g., by landing a contact at least partially on an upper surface of each respective stair (i.e., extension 130, 132) of the cascading, staircase arrangement.

There are several ways to form alternating p-type and n-type layers 120, 122 over substrate 102. For the FIG. 1 embodiment, as shown in FIGS. 5-8, forming stack 124 of alternating p-type and n-type layers 120, 122 may include, sequentially, for each respective semiconductor layer: epitaxially forming a semiconductor layer 150 over substrate 102; forming a mask 152 over (CMOS) region 106 of semiconductor layer 150, leaving the other (photodetector) region 104 of semiconductor layer exposed 150; doping the exposed region 104; removing mask 152; and repeating the process for as many layers as desired. The process includes alternatingly doping region 104 of semiconductor layer 150 with one of a p-type dopants to form p-type layer 120 (FIG. 5) and an n-type dopant to form n-type layer 122 (FIG. 6). Mask 152 may include any now known or later developed mask material, e.g., a photoresist or a silicon nitride hard mask. Doping may include any appropriate doping process such as ion implanting, among others. After doping, mask 152 may be removed using any appropriate process, e.g., a wet etch for a nitride mask or an ashing process for a resist-based mask. After mask 152 removal, the process repeats for any desired next layer 120, 122. As shown in FIGS. 7-8, the layer formation process can repeat for as many layers as desired in photodetector 110 (FIG. 1). Once the stack is complete, as shown by a dashed box in FIG. 8 for clarity, TI 108 (and perhaps TI(s) 114 (not shown)) can be formed in any now known or later developed manner, and may include any appropriate dielectric, e.g., silicon nitride ($Si_3N_4$), silicon oxide ($SiO_2$), fluorinated $SiO_2$ (FSG), hydrogenated silicon oxycarbide (SiCOH), and/or porous SiCOH.

Figure 9:
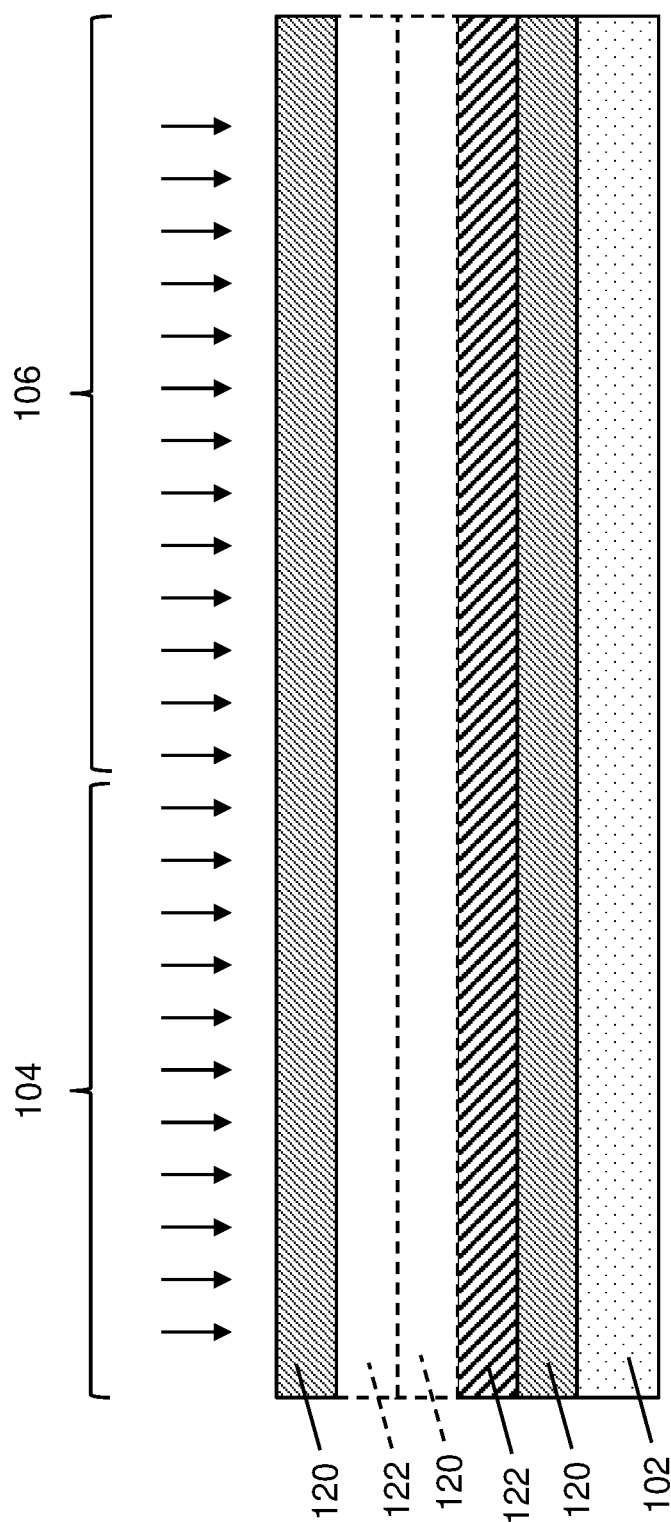
FIGS. 9 and 10 show cross-sectional views of forming alternating p-type and n-type semiconductor layers for the photodetector of FIG. 4, according to other embodiments of the disclosure.
Figure 10:
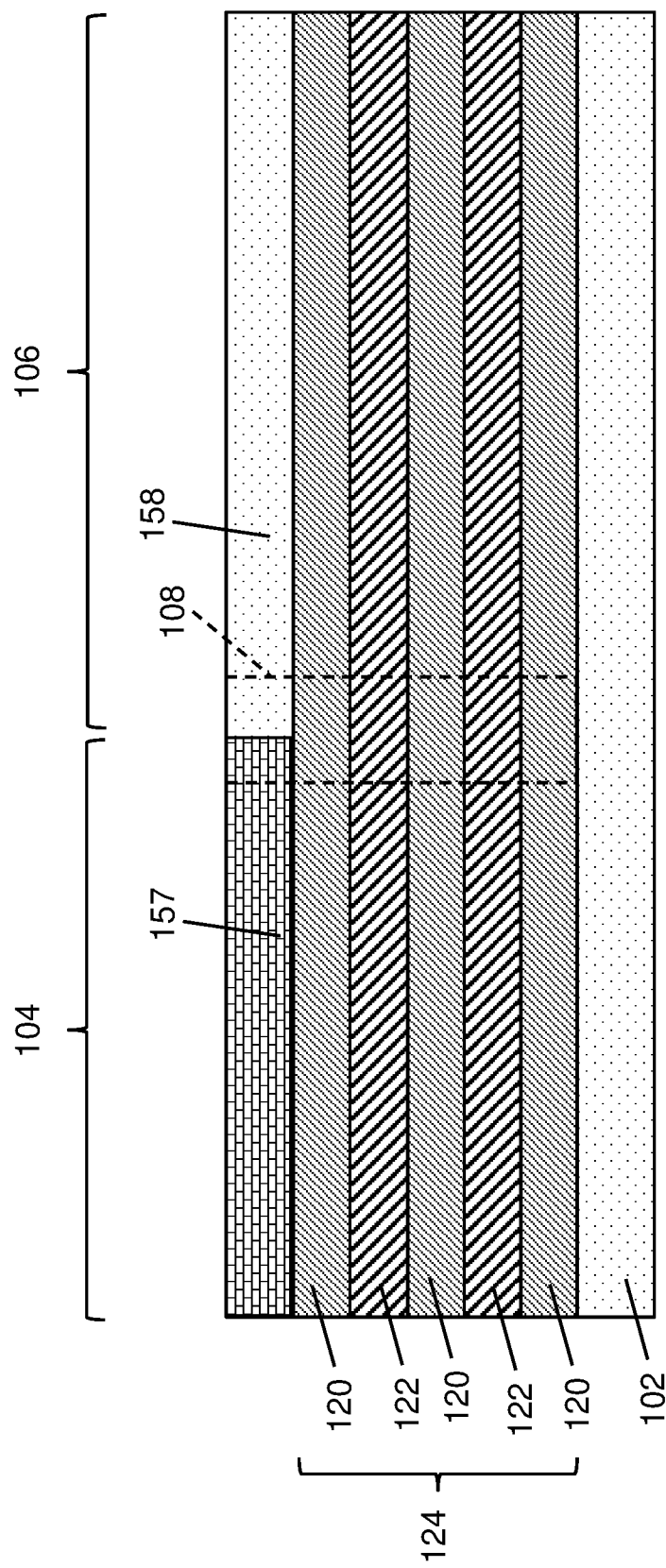

For the FIG. 4 embodiment, as shown in FIGS. 9-10, forming stack 124 of alternating p-type and n-type layers 120, 122 may include epitaxially forming a plurality of semiconductor layers 120, 122 on substrate 102 while in-situ doping alternating semiconductor layers of the plurality of semiconductor layers with a p-type dopant to form a p-type layer 120 and an n-type dopant to form an n-type layer 122. As shown in FIGS. 9-10, the layer formation process can repeat for as many layers as desired in photodetector 110 (FIG. 1) (second p-type layer 122 and second n-type layer 122 formation shown in dashed lines in FIG. 9). Once stack 124 is complete, as shown in FIG. 10, a hard mask 157 may be formed over stack 124 in region 104, and another (undoped) semiconductor layer 158 may be epitaxially formed over region 106 (for CMOS devices 112 (FIG. 4)) adjacent mask 157 over region 104 of substrate 102. At this stage, as shown by a dashed box in FIG. 10 for clarity, TI 108 (and perhaps TI(s) 114 (not shown)) can be formed in any now known or later developed manner, and may include any appropriate dielectric, e.g., silicon nitride ($Si_3N_4$), silicon oxide ($SiO_2$), fluorinated $SiO_2$ (FSG), hydrogenated silicon oxycarbide (SiCOH), and/or porous SiCOH. Mask 157 may then be removed using any appropriate removal process for the masking material employed, e.g., a wet etch for a hard mask material such as a nitride.

Figure 11:
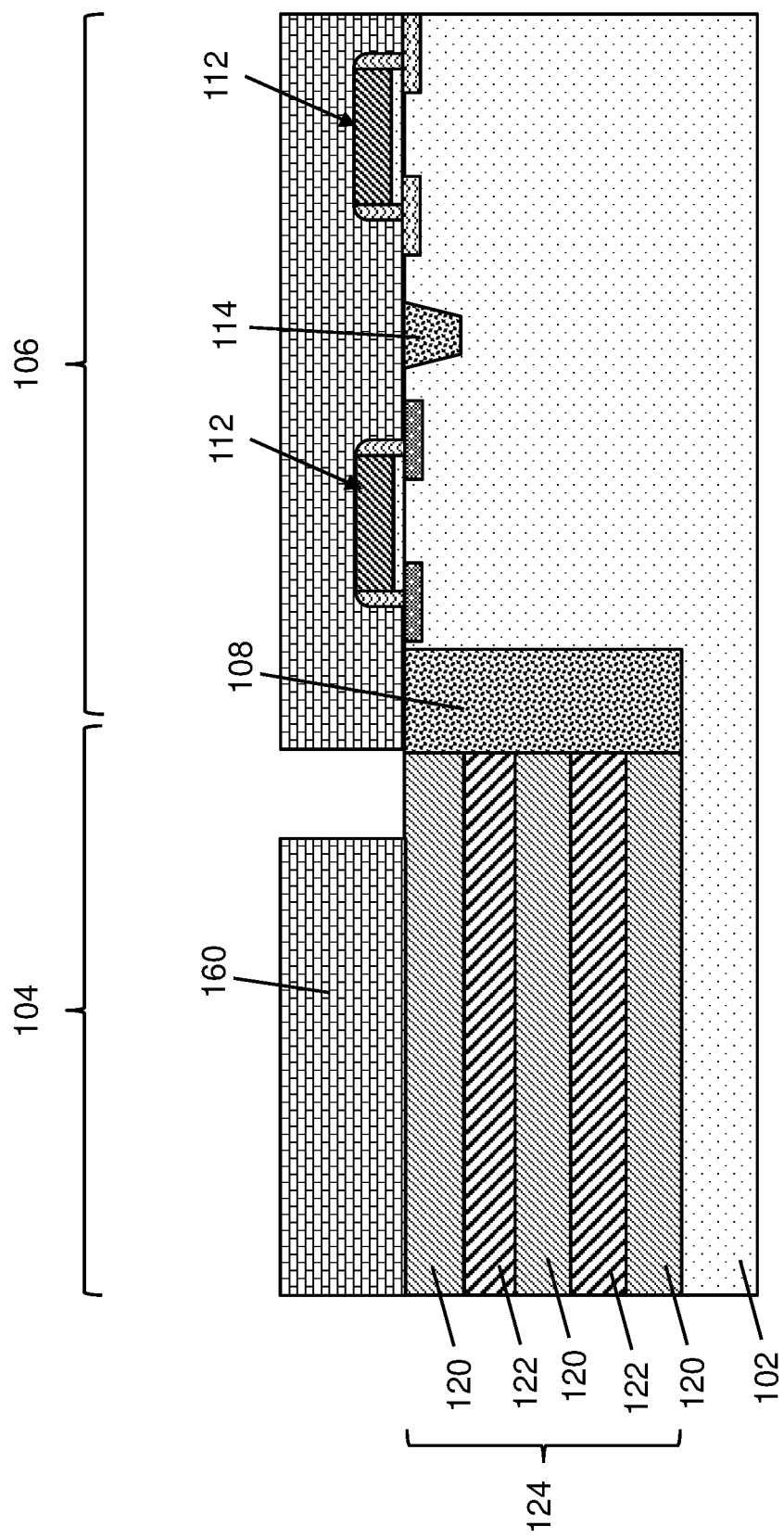
FIGS. 11 and 12 show cross-sectional views of forming a CMOS device and initial steps of forming a cascading, staircase arrangement within the alternating p-type and n-type semiconductor layers for the photodetector of FIGS. 1, 2 and 4, according to embodiments of the disclosure.
Figure 12:
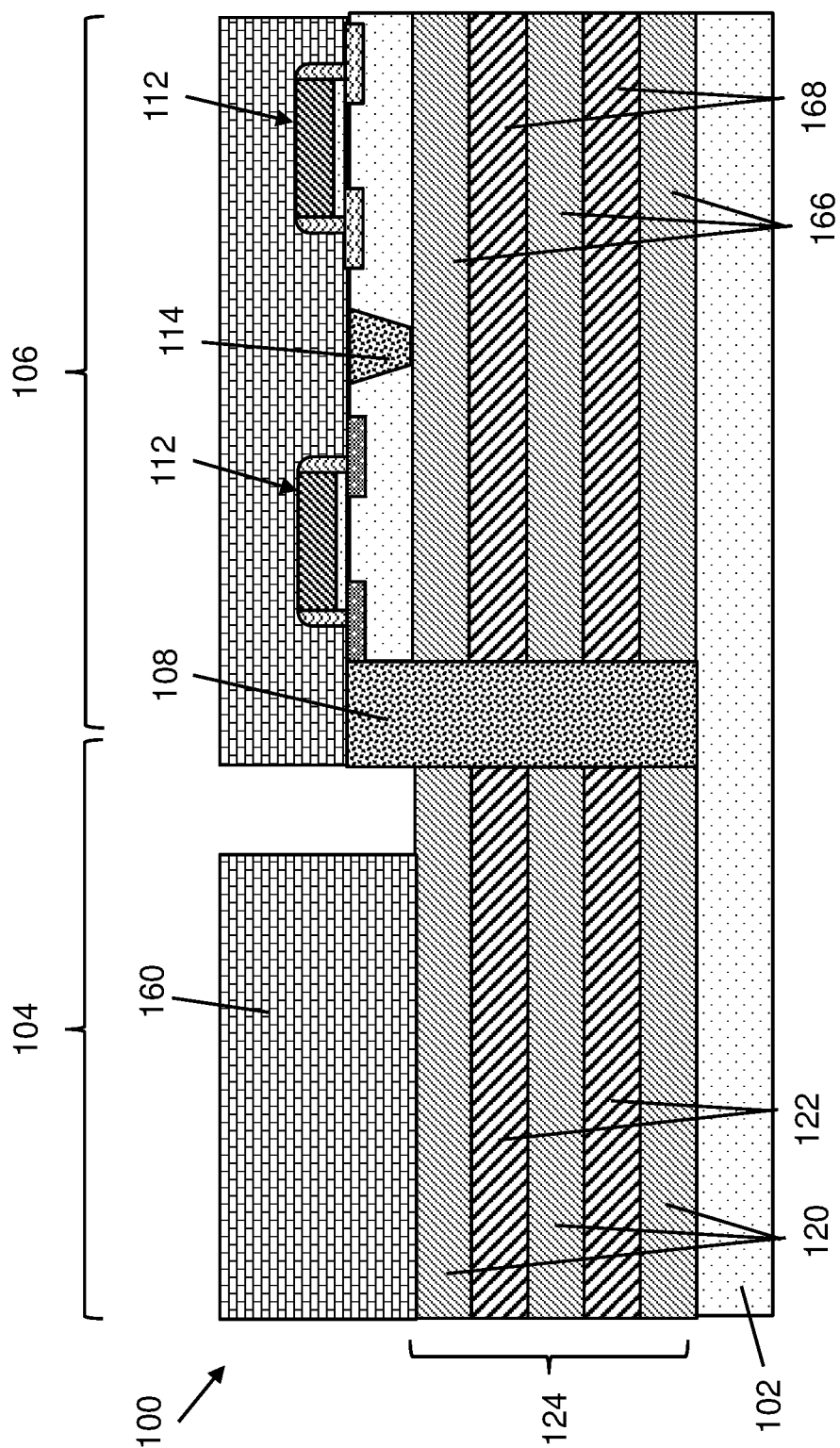

At this stage, as shown in FIG. 11 for the FIG. 8 embodiment and in FIG. 12 for the FIG. 10 embodiment, the method may optionally include forming CMOS device(s) 112 in region 106 of substrate 102 adjacent (photodetector) region 104. CMOS device(s) 112 can be formed using any now known or later developed semiconductor fabrication techniques. As shown in FIG. 11, if not already completed, TI 108 (and TI(s) 114) may also be formed in substrate 102 to isolate regions 104 from region 106, e.g., prior to device 112 formation. TI 108 and TI(s) 114 can be formed in any now known or later developed manner, and may include any appropriate dielectric, e.g., silicon nitride ($Si_3N_4$), silicon oxide ($SiO_2$), fluorinated $SiO_2$ (FSG), hydrogenated silicon oxycarbide (SiCOH), and/or porous SiCOH. In FIG. 12, TI 108 separates semiconductor layers 120, 122 between regions 104, 106, creating p-type layers 166 and n-type layers 168 in CMOS region 106.

There are several ways to form extensions 130, 132 in the cascading, staircase arrangement of FIGS. 1, 2 and 4. FIGS. 13-16 show cross-sectional views of one illustrative process of forming extensions 130, 132 in the cascading, staircase arrangement. The process may include forming a mask 160 (FIGS. 11 and 12) covering stack 124 of alternating p-type layers 120 and n-type layers 122 over substrate 102. Mask 160 may include any appropriate masking material, e.g., a resist. Mask 160 may also cover (CMOS) region 106 to protect any structure therein, e.g., CMOS devices 112 if already formed. As shown in FIGS. 13-16, the process may include, sequentially, from an uppermost semiconductor layer 162 (p-type layer 120 as shown) in stack 124 of alternating p-type and n-type layers 120, 122 toward a lowermost semiconductor layer 164 (p-type layer 120 as shown) thereof and excepting lowermost semiconductor layer 164 thereof: Trimming mask 160 covering stack 124 to expose an upper surface of an end portion 170 (dashed boxes) of a respective semiconductor layer 120, 122 and an end portion 172 of any semiconductor layer 122, 120 thereabove on the selected side of stack 124, and etching to remove end portion 170 (dashed box) of the respective semiconductor layer and end portion 172 of any semiconductor layer thereabove. The process can repeat as many times as there are layers. The sequential and progressive etching result in the cascading and staircase arrangement (see FIGS. 1, 2, and 4). The etching can include any chemistry appropriate for the materials to be removed, e.g., a reactive ion etch, among other possibilities. Once complete, a remaining portion 174 (FIG. 16) of mask 160 can be removed using any appropriate removal process, e.g., an ashing process for a resist-based mask.

FIG. 1 shows structure 100 as completed from the FIG. 11 embodiment, and FIG. 4 shows structure 300 as completed from the FIG. 12 embodiment, i.e., in the latter case, with layers 166, 168 in CMOS region 106. As shown in FIGS. 1 and 4, dielectric 138 may be formed over the cascading, staircase arrangement on the selected side of stack 124 in any known fashion. If not already formed, at this stage, the method may optionally include forming CMOS device(s) 112 in region 106 of substrate 102 adjacent (photodetector) region 104. For example, TI 108 and TI(s) 114 may be formed, as previously described. CMOS device(s) 112 can be formed using any now known or later developed semiconductor fabrication techniques. In any event, dielectric 142 may be deposited, and contacts 140, 144 may be formed in any known fashion to photodetector 110 and CMOS device(s) 112, respectively. A contact 140 is operatively coupled to each extension 130, 132, as described herein.

FIGS. 17-19 show cross-sectional views of forming structure 200 in FIG. 3, according to other embodiments of the disclosure. In this case, forming alternating p-type layers 220 and n-type layers 222 over substrate 102 may include starting with forming either p-type layer 220 (shown in FIG. 17) or n-type layer 222, then sequentially repeating the steps until as many of each layer 220, 222 as desired is formed. As shown in FIG. 17, forming p-type semiconductor layer 220 may include: epitaxially forming a p-type semiconductor where the epitaxially forming creates a p-type semiconductor layer 220 over any semiconductor material thereunder (substrate 102 in FIG. 17). The step may also form a p-type polycrystalline extension 230M adjacent p-type layer 220 at a first end 280 of stack 124 (FIG. 4) (or the semiconductor layers (just 222 at this stage)) and over any dielectric thereunder (none present in FIG. 17, see FIG. 19). Note, for a lowermost layer 236, as shown in FIG. 17, extension 230M of lowermost layer 236 is not discernible from the rest of semiconductor layer (p-type layer 222 in this example), regardless of the doping type of the layer. Similarly, what will be eventually be first end 280 of semiconductor layers 220, 222 above lowermost layer 236 is not discernible.

Doping may occur in any now known or later developed fashion, e.g., in-situ doping, ion implanting, among others. FIG. 17 also shows forming dielectric 252 adjacent to p-type semiconductor layer 222 at what will be second end 284 of semiconductor layers (only lowermost layer 236 shown) opposite what will be first end 280 of stack 124 and the semiconductor layers. Dielectric 252 may be formed in a similar manner to TI 108 and TI(s) 114 and may include the same materials, e.g., an oxide, or other ILD materials.

FIG. 18 shows forming an n-type layer 222. Forming n-type layer 222 may include: epitaxially forming an n-type semiconductor, where the epitaxially forming creates n-type semiconductor layer 222 over any semiconductor material, e.g., p-type layer 220, thereunder and an n-type polycrystalline extension 232 adjacent n-type semiconductor layer 222 at second end 284 of semiconductor layers 220, 222 and over any dielectric (e.g., dielectric 252) thereunder. Doping may occur in any now known or later developed fashion, e.g., in-situ doping, ion implanting, among others. FIG. 18 also shows forming dielectric 250 adjacent to n-type semiconductor layer 222 at what will be first end 280 of semiconductor layers 220, 222 opposite what will be second end 284 of semiconductor layers 220, 222, and over extension 230M. Dielectric 250 may be formed in a similar manner to TI 108 and TI(s) 114 and may include the same materials, e.g., an oxide, or other ILD material. Formation of dielectric 250 may remove part of n-type layer 222 formed over extension 230M of p-type layer 220.

FIG. 19 shows forming additional p-type and n-type layers 220, 222. In the example shown, two more p-type layers 220 and one more n-type layer 222 is formed, matching structure 200 of FIG. 3. Forming another p-type layer 220 may include: epitaxially forming a p-type semiconductor, where the epitaxially forming creates p-type semiconductor layer 222 over any semiconductor material, e.g., n-type layer 222, thereunder and a p-type polycrystalline extension 230 adjacent p-type semiconductor layer 220 at first end 280 of semiconductor layers 220, 222 and over any dielectric (e.g., dielectric 250) thereunder. Again, doping may occur in any now known or later developed fashion, e.g., in-situ doping, ion implanting, among others. FIG. 19 also shows forming dielectric 252 adjacent to p-type layer 220 at second end 284 of semiconductor layers 220, 222 opposite first end 280 of semiconductor layers 220, 222, and over extension 232 of n-type layer 222 thereunder. Dielectric 252 may be formed in a similar manner to TI 108 and TI(s) 114 and may include the same materials, e.g., an oxide, or other ILD material. Formation of dielectric 252 may remove part of p-type layer 220 and is formed over extension 232 of n-type layer 222.

Referring again to FIG. 3, the drawing shows forming CMOS device(s) 112 in region 106 of substrate 102 adjacent (photodetector) region 104. For example, TI 108 and TI(s) 114 may be formed, as previously described. In FIG. 3, TI 108 separates semiconductor layers 120, 122 between regions 104, 106, creating p-type layers 166 and n-type layers 168 in CMOS region 106. CMOS device(s) 112 can be formed using any now known or later developed semiconductor fabrication techniques. Similarly to the process shown in FIG. 10 for the FIG. 4 embodiment, once stack 124 is complete, a hard mask (not shown in FIG. 3, see FIG. 10) may be formed over stack 224 in region 104, and another (undoped) semiconductor layer 258 may be epitaxially formed over region 106 adjacent the mask over region 104 of substrate 102. The mask may then be removed using any appropriate removal process for the masking material used. CMOS devices 112 are built in/on undoped semiconductor layer 258 over the alternating layers 166, 168. Dielectric 142 may be deposited over both regions 104, 106 for interconnect layers.

FIG. 3 also shows forming contact 240 operatively coupled to extensions 230, 230M of p-type layers 222. Contact 240 may also extend through dielectric 142. Here, contact 240 is formed to extend through p-type polycrystalline extensions 230 of p-type layers 220 and dielectric 250 therebetween (and/or thereover). Similarly, forming contact 242 operatively coupled to extensions 232 of n-type layers 220 includes forming contact 242 to extend through n-type polycrystalline extensions 232 of n-type layers 222 and dielectrics 252 therebetween (and/or thereover). Contact 242 may also extend through dielectric 142. Contacts 240, 242 can be formed using any now known or later developed technique, so long as they extend through extensions 230, 232, respectively. In this embodiment, a single contact 240, 242 may be operatively coupled to extensions 230, 232, respectively. Contacts 244 may also be formed in any known fashion to CMOS device(s) 112.

Embodiments of the disclosure provide various technical and commercial advantages, examples of which are discussed herein. Photodetectors 110, 210 are simpler to form than conventional photodetectors and the processes can be integrated into CMOS device formation. Photodetectors 110, 210 can detect and convert near-infrared (NIR) light, e.g., having wavelengths of greater than 0.75 micrometers.

The method as described above is used in the fabrication of photonic integrated circuit (PIC) chips. The resulting PIC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a substrate including a first region including a photodetector including:
      a stack including alternating p-type semiconductor layers and n-type semiconductor layers in contact with each other, wherein a plurality of the semiconductor layers include an extension extending beyond an end of an adjacent semiconductor layer of the alternating p-type semiconductor layers and n-type semiconductor layers, wherein the extensions are in a cascading, staircase arrangement on a selected side of the stack;
      a dielectric over the cascading, staircase arrangement on the selected side of the stack; and
      a contact operatively coupled to an upper surface of each extension of the cascading, staircase arrangement through the dielectric.

2. The structure of claim 1, wherein the contact operatively coupled to the upper surface of each extension lands at least partially on the upper surface of a respective stair of the cascading, staircase arrangement.

3. The structure of claim 1, wherein the substrate includes a second region adjacent the first region, the second region isolated from the first region by a trench isolation, and the second region including a complementary metal-oxide semiconductor (CMOS) device therein.

4. The structure of claim 1, wherein the stack includes at least three semiconductor layers.

5. A structure, comprising:
   a substrate including a first region adjacent a second region;
   a photodetector in the first region, the photodetector including:
      a stack of alternating p-type semiconductor layers and n-type semiconductor layers in contact with each other, wherein a plurality of the semiconductor layers includes an extension extending beyond an end of an adjacent semiconductor layer of the alternating p-type semiconductor layers and n-type semiconductor layers, wherein the extensions of the p-type semiconductor layers extend beyond an end of the n-type semiconductor layers on a first side of the stack, and the extensions of the n-type semiconductor layers extend beyond an end of the p-type semiconductor layers on a second side of the stack, and wherein a first dielectric is positioned between the p-type extensions and a second dielectric is positioned between the n-type extensions, and
      a contact operatively coupled to each extension;
   a complementary metal-oxide semiconductor (CMOS) device in the second region; and
   a trench isolation separating the first region and the second region.

6. The structure of claim 5, wherein the contact operatively coupled to each extension of the p-type semiconductor layers extends through the extensions of the p-type semiconductor layers and the first dielectric positioned therebetween, and the contact operatively coupled to each extension of the n-type semiconductor layers extends through the extensions of the n-type semiconductor layers and the second dielectric positioned therebetween.

7. The structure of claim 6, wherein the contact extending through the extensions of the p-type semiconductor layers includes a first single contact, and the contact extending through the extensions of the n-type semiconductor layers includes a second single contact.

8. The structure of claim 5, wherein each n-type semiconductor layer and each p-type semiconductor layer includes monocrystalline semiconductor, and the extensions of each n-type semiconductor layer and each p-type semiconductor layer includes polycrystalline semiconductor.

9. A method, comprising:
   forming alternating p-type semiconductor layers and n-type semiconductor layers in a stack over a first region of a substrate with each semiconductor layer including an extension extending beyond an end of an adjacent semiconductor layer of the alternating p-type semiconductor layers and n-type semiconductor layers, each extension having the same doping type as the semiconductor layer adjacent thereto, wherein forming alternating p-type semiconductor layers and n-type semiconductor layers over the substrate includes starting with either step a) or b) then sequentially repeating the steps of:
      a) epitaxially forming a p-type semiconductor, the epitaxially forming creating a p-type semiconductor layer over any semiconductor material thereunder and a p-type polycrystalline extension adjacent the p-type semiconductor layer at a first end of the semiconductor layers over any dielectric thereunder, and forming a first dielectric adjacent to the p-type semiconductor layer at a second end of the semiconductor layers opposite the first end of the semiconductor layers; and
      b) epitaxially forming an n-type semiconductor, the epitaxially forming creating an n-type semiconductor layer over any semiconductor material thereunder and an n-type polycrystalline extension adjacent the n-type semiconductor layer at the second end of the semiconductor layers over any dielectric thereunder, and forming a second dielectric adjacent to the n-type semiconductor layer at the first end of the semiconductor layers opposite the second end of the semiconductor layers; and
   forming a contact operatively coupled to each extension.

10. The method of claim 9, wherein forming the contact operatively coupled to each extension includes:
    forming a first contact to extend through, at the first end of the semiconductor layers, each p-type polycrystalline extension and each second dielectric, and
    forming a second contact to extend through, at the second end of the semiconductor layers, each n-type polycrystalline extensions and each first dielectric.

11. The method of claim 9, further comprising forming a complementary metal oxide semiconductor (CMOS) device in a second region of the substrate adjacent the first region, and forming a trench isolation in the substrate to isolate the second region from the first region.

12. The method of claim 9, further comprising:
    forming a trench isolation in the substrate to isolate the first region from a second region; and forming a complementary metal-oxide semiconductor (CMOS) device in the second region of the substrate adjacent the first region.

\* \* \* \* \*